(12) United States Patent
Hager et al.

(10) Patent No.: US 6,384,614 B1
(45) Date of Patent: May 7, 2002

(54) SINGLE TIP KELVIN PROBE

(75) Inventors: Edward J. Hager, Montclair; Rondal K. Harmon, Jr., Chino, both of CA (US)

(73) Assignee: Fluke Corporation, Everett, CA (US)

( * ) Notice: Subject to any disclaimer, the term of this patent is extended or adjusted under 35 U.S.C. 154(b) by 0 days.

(21) Appl. No.: 09/497,415

(22) Filed: Feb. 5, 2000

(51) Int. Cl.$^7$ .............................................. G01R 31/02
(52) U.S. Cl. ...................................................... 324/754
(58) Field of Search .............................. 324/754, 72.5, 324/758; 439/82, 264, 482, 736; 33/503, 559, 832

(56) References Cited

U.S. PATENT DOCUMENTS

| 3,609,539 A | | 9/1971 | Gunthert | |
|---|---|---|---|---|
| 4,123,706 A | * | 10/1978 | Roch | 324/158 P |
| 4,344,315 A | * | 8/1982 | Moxon et al. | 374/14 |
| 4,721,903 A | * | 1/1988 | Harsh et al. | 324/72.5 |
| 4,764,722 A | * | 8/1988 | Coughlin et al. | 324/158 P |

* cited by examiner

Primary Examiner—Safet Metjahic
Assistant Examiner—Etienne LeRoux
(74) Attorney, Agent, or Firm—Leon D. Rosen

(57) ABSTRACT

A Kelvin probe system is described for measuring resistance between two locations on an electrical device, by the use of two probe assemblies that each includes two wires, wherein each probe assembly is of simplified construction, easier to use, and more reliable. Each probe assembly (110, 112) includes a single point probe tip (12) with a pointed proximal end (102) for engaging a device contact and with a distal end (106). A cable (110) with voltage and current conductors (114, 116) has distal ends (120, 122) connected to contacts of a connector, and proximal ends (130, 132) each connected to the distal end of the probe tip. Although a large current passes through the current conductor (116) and through the length of the probe tip, the resistance-caused voltage drop across the probe tip is very small and therefore does not significantly affect accuracy of a resistance measurement.

11 Claims, 3 Drawing Sheets

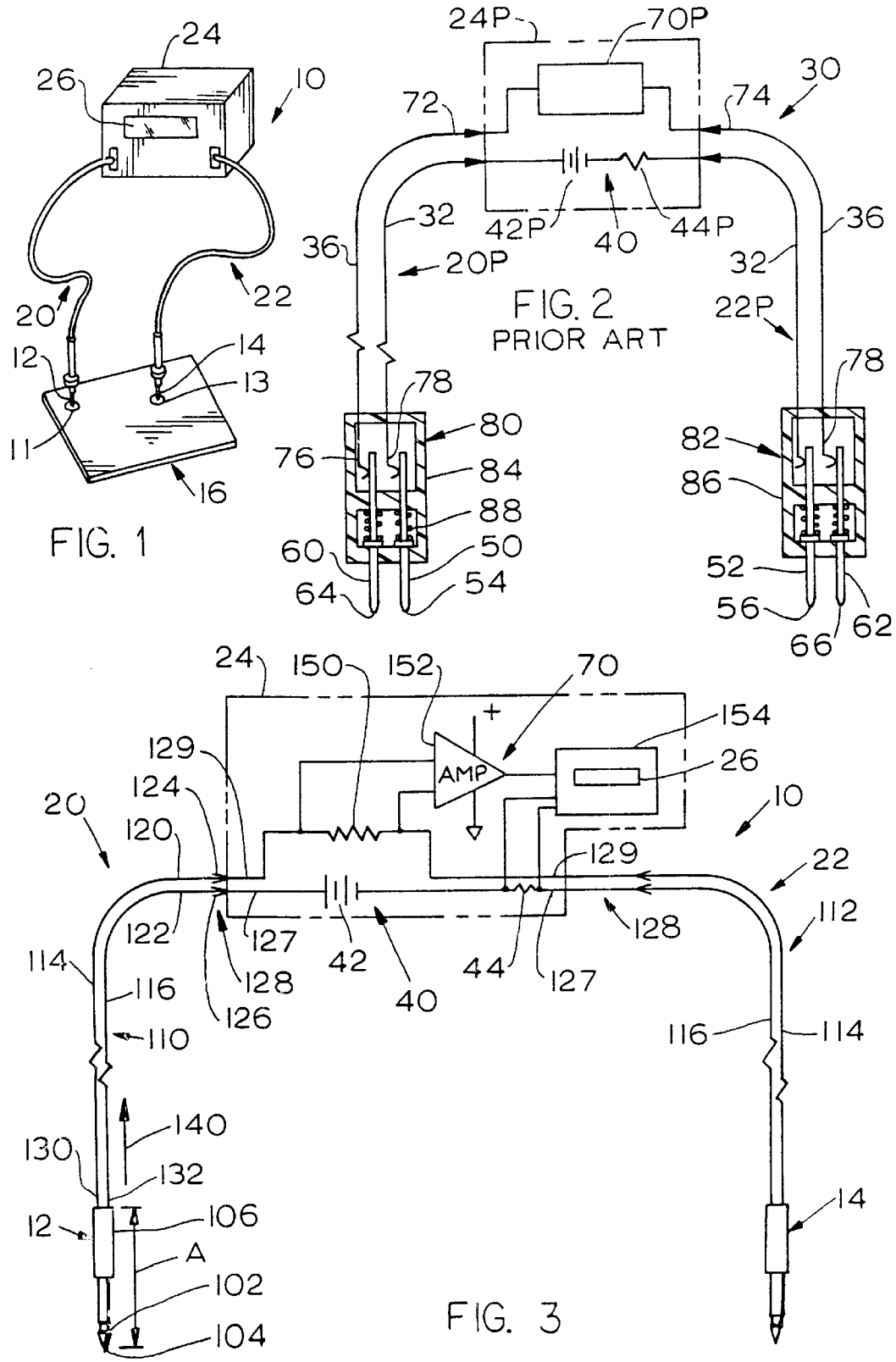

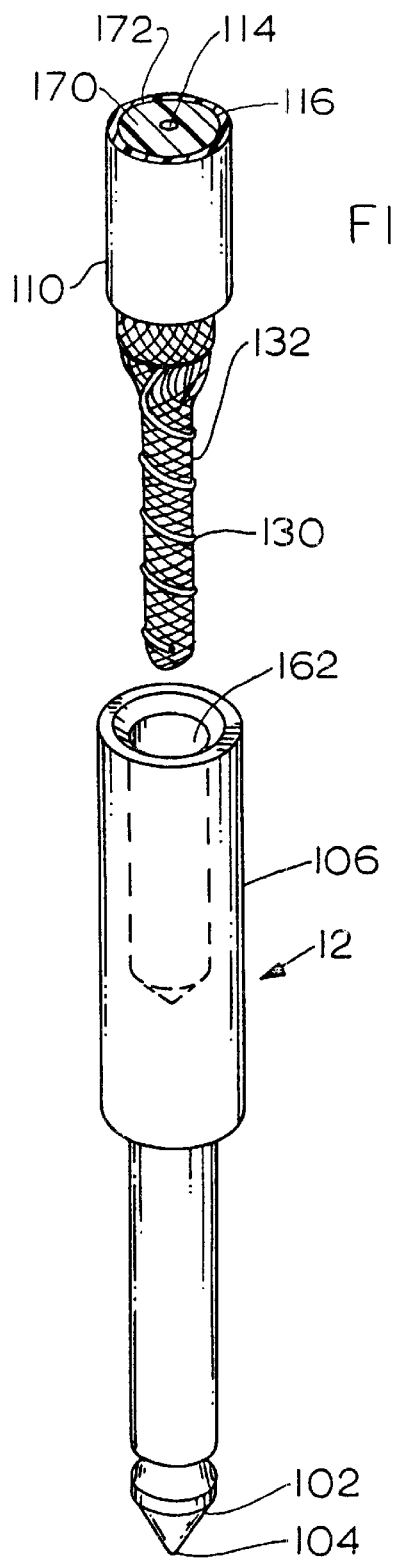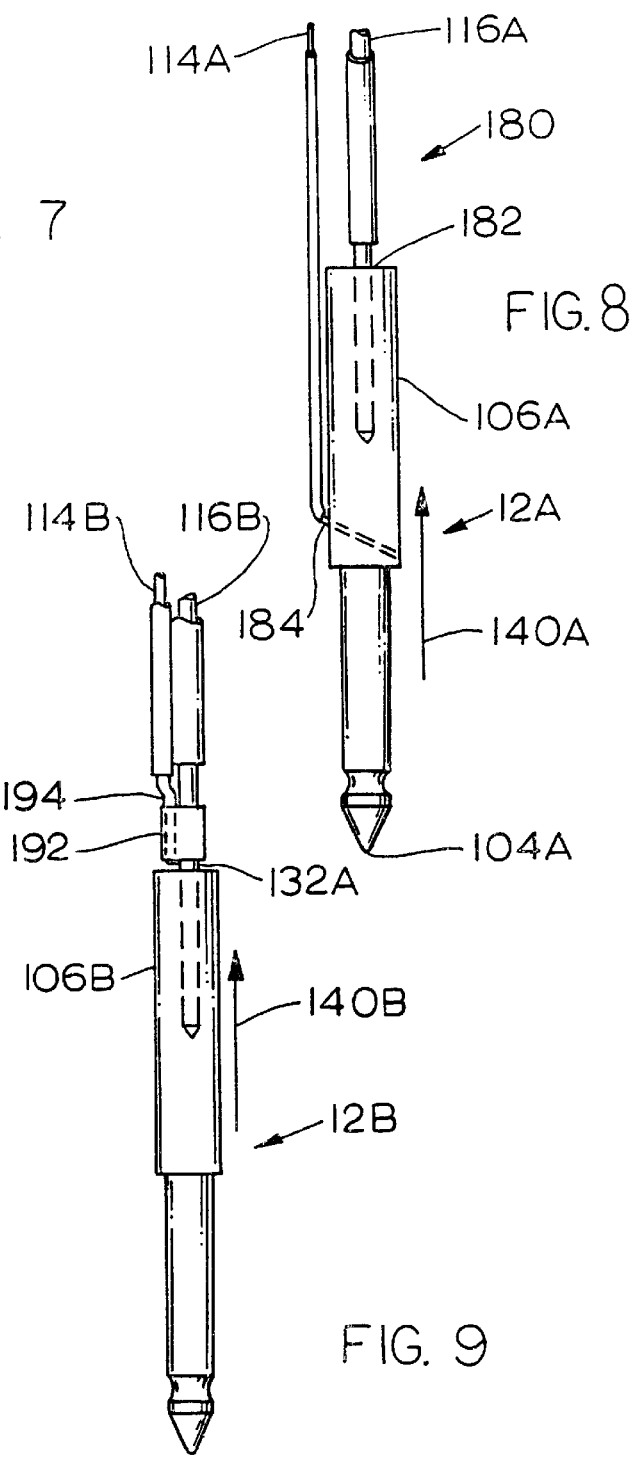

SINGLE TIP KELVIN PROBE

BACKGROUND OF THE INVENTION

The resistance of a device having moderate resistance (e.g. within a few orders of magnitude of 10 k ohms) can be measured with low to moderate accuracy by an ohmmeter. In an ohmmeter, current passes from one probe tip, through a first wire, through a circuit that supplies current and that measures the current flow through a resistor of the circuit, and through a second wire to a second probe tip. The accuracy of resistance measurement is affected by voltage drops along the lengths of the first and second wires due to current flows through them.

Where resistance is to be measured with high accuracy, or the electrical device has a low resistance (e.g. well below 10 ohms), a Kelvin probe system is used. In a prior Kelvin system, each probe assembly included two probe tips, one for carrying considerable current and the other for carrying substantially no current. Current flowed from the current probe tip and through a current wire, through a current source, and through the other current wire and current probe tip, to provide current to flow through contacts of the electrical device and through the device. The voltage between the two contacts of the electrical device was sensed by the separate voltage probe tips that also engaged the contacts. The voltage of each probe tip was transmitted through a separate voltage wire to a circuit that measured the voltage drop. Of course, the voltage drop for a given current through the device, enables measurement of resistance of the device. Since substantially no current passed through the voltage probe tips or voltage wires, the measurement of voltage drop between the contacts of the electrical device was highly precise. To assure that the current and voltage tips of each probe assembly securely engaged a contact of the electrical device, each probe tip was separately slideable and spring loaded. The need to provide separate current and voltage probe tips that were each slideable, resulted in high cost, less than high reliability, and difficulty in engaging small contacts. A Kelvin probe assembly which was of simple design, which was rugged, and which could be easily applied to small contacts, would be of value.

SUMMARY OF THE INVENTION

In accordance with one embodiment of the present invention, a Kelvin probe apparatus is provided for use in a Kelvin probe system that measures impedance (e.g. resistance), where the Kelvin probe apparatus is of simple, rugged, and easy-to-use design, and still allows a high current flow between its proximal and distal ends while providing an accurate indication at its distal end, of the voltage at the proximal end of the probe tip. The probe apparatus includes a probe tip mounted on a handle and having a pointed proximal end and an opposite distal end. A cable has two parallel conductors, these being voltage and current conductors. Each conductor is connected to a different terminal of a connector at the distal end of the probe assembly. Each conductor is coupled to the distal end of the probe tip. Current flows through the single pointed end of the probe tip, through the length of the probe tip to its distal end, and through the current wire to a current terminal of the connector. Substantially no current flows through the voltage conductor, so its opposite ends are at substantially the same potential, which is the potential at the distal end of the probe tip rather than the proximal end of the probe tip. However, the resistance between the proximal and distal ends of the probe tip is very low, being less than 10% of the resistance along the voltage conductor. As a result, the voltage at the distal end of the voltage conductor is very close to the voltage at the proximal end of the probe tip, thereby providing a precise indication of voltage and therefore resistance. It is noted that in some cases impedance at a particular frequency is measured, and the same probe assembly can be used for impedance measurements for a range of frequencies.

The novel features of the invention are set forth with particularity in the appended claims. The invention will be best understood from the following description when read in conjunction with the accompanying drawings.

BRIEF DESCRIPTION OF THE DRAWINGS

FIG. 1 is an isometric view of a Kelvin probe system that includes Kelvin probe assemblies of the present invention shown connected to contact location of an electrical device.

FIG. 2 is a partially sectional and partially schematic diagram of a Kelvin probe system of the prior art.

FIG. 3 is a partially side elevation view and partially schematic view of a Kelvin probe system of one embodiment of the present invention.

FIG. 7 is an exploded view of the probe tip and a portion of the cable of FIG. 5, with the cable prepared for connection to the probe tip.

FIG. 8 is a side elevation view of a portion of a Kelvin probe assembly of another embodiment of the invention.

FIG. 9 is a partial side elevation view of a Kelvin probe assembly of still another embodiment of the invention.

DESCRIPTION OF THE PREFERRED EMBODIMENTS

Figure 4:
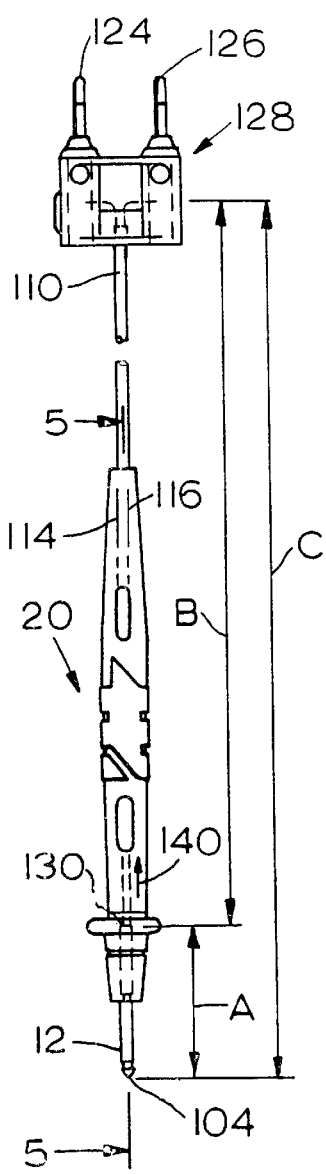
FIG. 4 is a side elevation view of one of the Kelvin probe assemblies of the system of FIG. 3.

FIG. 1 shows a Kelvin probe system 10 which can be used to measure the resistance or other form of impedance between a pair of contact locations 11, 13 of an electrical device 16. The system includes two Kelvin probe apparatuses or assemblies 20, 22 with probe tips 12, 14, and a Kelvin resistance measuring circuit 24. The circuit generates current that passes through the probes and through the electrical device between its contact locations 11, 13. The circuit also indicates, on a display 26, the resistance of the electrical device between those locations. In the following description, ends of parts closest to contact locations 12, 14 are referred to a "proximal" ends, while ends farthest therefrom are referred to as "distal" ends.

FIG. 2 shows a prior art 4-wire system, or Kelvin probe system 30. The system includes two probe assemblies 20P, 22P that each has two conductors, including a current conductor 32, and a voltage conductor 36. The circuit 24P included a source of current 40 such as a battery 42P and a current-limiting resistor 44P which might be part of the battery. The current conductors were connected through current probes 50, 52, whose pointed proximal ends 54, 56 actually engaged the contact locations of the electrical device such as 16 in FIG. 1. The current passing through the electrical device resulted in a voltage drop between the two contact locations 11, 13 of the electrical device. The prior art probe assemblies of FIG. 2 also had voltage probes 60, 62 with pointed proximal ends 64, 66 that also engaged the contact locations of the electrical device. The voltage conductors 36 connected the voltage probes 60, 62 to a subcircuit 70P that measured the voltage across the distal ends 72, 74 of the voltage conductors. The subcircuit 70P provided a high resistance path for any current flow, so the voltage at the distal ends 72, 74 of the voltage conductors was very closely the same as the voltage at the proximal ends 76, 78 of the voltage conductors, and was the same as the voltage at the pointed ends 64, 66 of the voltage probes. Thus, by having separate current flow paths and voltage sensing paths, the prior art Kelvin probe system made accurate measurements of resistance (and/or impedance).

In order to measure resistance between two locations on an electrical device, both current and voltage probes such as 50, 60 of each probe tip assembly 80, 82 had to engage a corresponding contact location. To assure that both probes such as 50, 60 simultaneously engaged a contact location, both probes were slideably mounted on a probe tip housing 84, 86 and were biased by a spring 88. Also, the pointed ends 54, 64 of adjacent current and voltage probes such as 50, 60 had to be separated. The need to slideably mount each probe and spring bias it, as well as to use two spaced probes with pointed ends that both had to engage contact location, resulted in some disadvantages. It resulted in a considerable cost for each probe tip assembly, made it difficult to engage contact locations of small width, and required extra care in applying each probe tip assembly to a contact location.

FIG. 3 illustrates a Kelvin probe system 10 of the present invention. Each Kelvin probe apparatus, or assembly 20, 22 includes an electrically conductive probe tip 12, 14 with a proximal end 102 that generally has a tapered contact point 104 that actually engages a contact location on an electrical device whose resistance or impedance is to be measured. Each probe tip also has a distal end 106. A cable 110, 112 of each probe assembly includes first and second or voltage and current conductors 114, 116. The voltage and current conductors have distal ends 120, 122 that are electrically isolated from each other and which are attached to corresponding connector terminals 124, 126 of a two-contact connector 128. The connector terminals are connected to circuit terminals 127, 129. However, proximal ends 130, 132 of the conductors are coupled together and to the distal end 106 of the probe tip.

Although each Kelvin probe assembly 20, 22 of FIG. 3 has a single probe tip 12, 14 to which the voltage and current conductors are coupled, the voltage at the distal end 120 of the voltage conductor is very close to the voltage at the contact point 104 of the probe tip. An analysis of the system shows that there is a relatively large current (depending upon the expected resistance to be measured) moving along a current path 140 that extends from the contact point 104 to the distal end 106 of the probe tip, along the current conductor 116 and through the current terminal 126 of the connector to the circuit 24. Any resistance along this current path results in a voltage drop proportional to that resistance. The length of the cable 110 is almost always at least 0.5 meter, with the most common lengths in the United States being 36 inches (91 cm) and 48 inches (122 cm).

FIG. 4 indicates the length A of the current path along the probe tip 12 between the contact point 104 and the location where the voltage conductor proximal end 130 engages the probe tip (or the current conductor proximal end). The length A is no more than 10% of the length C of the current path 140 between the contact point 104 and the current terminal 126. As a result, even if the resistance per unit length were the same along the probe tip 12 as along the current conductor 116, the voltage drop along the distance A would be no more than 10% of the voltage drop along the current path 140. In actuality, the resistance per unit length along the probe tip 12 is less than the resistance per unit length along the current conductor 116, so the voltage drop along the distance A is generally much less than 10% of the voltage drop along the current path 140. Thus, the error in voltage measurement due to a voltage drop along the distance A of the current path is very low, and a precision resistance measurement can be obtained despite ignoring such voltage drop.

It may be noted that in FIG. 3, the subcircuit 70 that measures resistance, is shown to include a very high resistance 150 (which may be part of amplifier 152) between the voltage conductors 114 of the two Kelvin probe assemblies 20, 22 so very little current (usually less than 1% of the current moving along the current path) flows through the voltage conductors and there is negligible voltage drop along them. An amplifier 152 amplifies the voltage difference between opposite ends of the resistance 150, and the voltage, which is proportional to resistance, is indicated by a resistance-indicating display 26. The voltage drop across the contact locations 11, 13 (FIG. 1) is proportional to the current flowing through the electrical device between those locations. A current source of closely controlled current can be used that is connected between the circuit current terminals 127, or a current source such as battery 42 of slightly variable voltage can be used with a low resistance resistor 44 in series with the battery. The voltage across the resistor 44 is proportional to the current that is flowing through the current conductors, and the subcircuit 70 including a part 154 which displays a resistance proportional to the sensed current, or unit resistance per unit current (ohms per ampere). Such Kelvin resistance measuring circuit 24 is known in the prior art.

Figure 5:
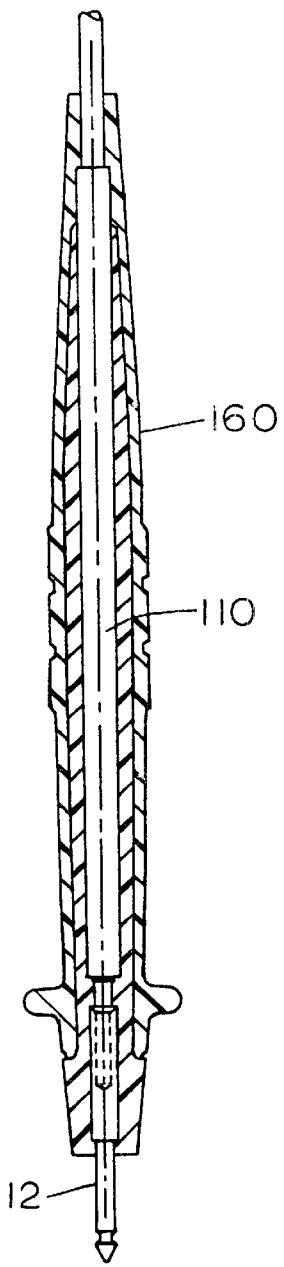
FIG. 5 is a view taken on line 5—5 of FIG. 4.
Figure 6:
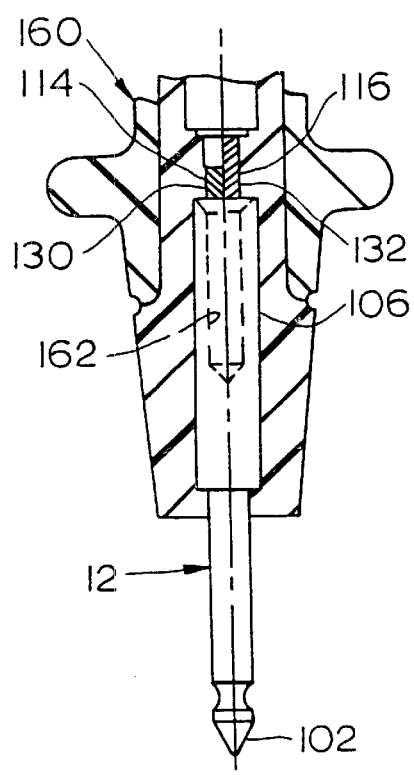
FIG. 6 is an enlarged view of a portion of the probe tip and handle of FIG. 5.

FIGS. 4–6 illustrate details of a probe tip 12 that applicant has constructed and tested. The conductors 114, 116 of the cable 110 are of copper, and the probe tip 12 is constructed of a copper alloy, preferably beryllium copper, to avoid appreciable galvanic effect between dissimilar metals that can produce a voltage, and to provide rigidity. The probe tip 12 is mounted in a dielectric handle 160. The probe 12 has a length A between its opposite ends, which is preferably no more than one tenth the shortest standard cable of 36 inches (91 cm) so the length A is preferably no more than 9 cm. The actual probe tip that applicant constructed had a length of about 3 cm, which is about 3% of the length of the current path when a standard cable (91 cm to 122 cm) length is used. The distal end 106 of the probe tip has a bore 162, and the proximal ends 130, 132 of the conductors are inserted into the bore 162 with the distal end 106 of the probe tip crimped around the conductor ends that lie in the bore.

FIG. 7 shows a common type of cable that is used, which is a coaxial cable 110. The coaxial cable has an inner conductor 114 that forms the voltage conductor, and an outer conductor 116 that forms the current conductor. The outer conductor 116 is generally in the form of a braiding. Inner and outer insulators 170, 172 separate and protect the conductors. The proximal end of the braiding that forms the outer conductor, is pressed together and preferably slightly twisted to form an elongated current conductor proximal end at 132. The inner conductor proximal end 130 is then helically wrapped about the proximal end of the braiding that forms the outer conductor. The combination is inserted into the bore 162. Then the distal end 106 of the probe tip is crimped around the proximal ends 130, 132 of the conductors.

FIG. 8 shows a portion of another Kelvin probe assembly 180. In this assembly, the current conductor 116A is connected at one location 182 to the distal end 106A of the probe 12A, while the voltage conductor 114A is connected to a spaced different location 184 on the probe tip. The location 184 is closer to the contact point 104A of the probe, so the location 184 where the voltage conductor is connected along the current path 140A is closer to the contact point 104A, although the reduced voltage drop is generally insignificant. It is noted that in FIG. 8, the two conductors 114A, 116A are not part of a coaxial cable, although they could be made to be part of such a cable.

FIG. 9 shows another Kelvin probe assembly 190 in which only the current conductor 116B is directly engaged with the probe tip 12B. The voltage conductor 114B is directly engaged with the proximal end 132A of the current conductor by a tube 192 that has been crushed to clamp the two conductors 114B, 116B together at a location slightly spaced but close to the distal end 106B of the probe tip. In this case, the connection at 194 of the voltage conductor 114B to the current path 140B where current flows through the probe tip and through the current conductor 116B, is spaced downstream from the location where the current conductor connects to the probe tip, but the distance is small and the voltage drop between the location 194 and the probe tip is negligible.

The above examples show that there is negligible voltage drop along the current path between the pointed end of the probe tip and the location where the voltage conductor connects to the current path, so long as the distance between the probe tip and the separation location such as 130 in FIG. 6, 184 in FIG. 8 and 194 in FIG. 9, is close to the pointed probe end. It may be noted that the pointed probe end preferably has a controlled radius of curvature. It also may be noted that current can be said to flow in either of two opposite directions, in any situation, depending upon whether conventional flow (from + to −) or the direction of electron movement is used.

The use of a single probe tip with a single pointed end, but with a negligible voltage drop between the pointed end and the separation point where the voltage conductor is connected to the current path, results in many advantages. The use of a single point probe tip makes measurement easier and faster. The rigid tip can withstand greater pressure, which can be useful to break through oxidation on a contact location on an electrical device. The fact that a single point tip can be used means that contact can be made with components that have smaller contact locations. The simplicity and lack of moving parts results in lower cost, greater reliability, and greater ease of use. It may be noted that in Kelvin probing, currents as low as 30 milliamperes or less may be used when measuring resistance across a high resistance, while currents up to perhaps 2 amperes or even more may be used in measuring the resistance between contacts where there is very low resistance. Where the resistance between the contact locations of the electrical device is moderate (e.g. 10 k ohms) this system allows resistance measurement with an accuracy within about one tenth percent. The very small voltage drop between the pointed end of the probe and the separation location generally has a negligible effect upon the accuracy.

Thus, the invention provides a Kelvin probe system and a Kelvin probe assembly or apparatus of such a system, which enables the use of a single point probe tip without significant reduction in accuracy of resistance measurement while providing a probe assembly that is simple, easy to use, and robust. A probe tip of short length is used, and the proximal ends of voltage and current conductors are coupled to the probe tip, with the voltage conductor connected to the current path that passes through the probe tip and current conductor, at a location that is on or close to the probe tip. The proximal ends of the two conductors can both be inserted into a bore in the distal end of the probe tip and crimped in place.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. Kelvin probe apparatus comprising:
a manually-moveable dielectric handle;
a rigid electrically conductive probe tip fixed to said handle, said probe tip having a single point proximal end and having a distal end with a bore;
a connector with first and second electrically independent connector terminals;
a cable with first and second conductors with said cable extending from said handle, said conductors each having a conductor distal end connected to a different one of said connector terminals, and said conductors each having a conductor proximal end;
at least one of said conductor proximal ends lies in said bore and said conductor proximal ends are electrically connected together.

2. The apparatus described in claim 1 including:
a Kelvin resistance measuring circuit that includes first and second pairs of circuit terminals with said first pair of circuit terminals having current and voltage circuit terminals that are connectable to said connector terminals, and with said second pair of circuit terminals having current and voltage circuit terminals;
said circuit having a current source of constant voltage connected between said circuit current terminals and said circuit having a subcircuit that indicates voltage and that is connected between said circuit voltage terminals;
a second Kelvin probe device which has a handle device, connector device, single point probe tip device, and cable device that are substantially identical to said handle, connector, probe tip and cable, with said connector device connected to said second set of circuit terminals.

3. The Kelvin probe apparatus describe in claim 1 wherein:
said conductor proximal ends are in contact with each other at said probe tip and are out of contact with each other at a separation point that is spaced from said probe tip;
said probe tip proximal end has a contact point, and the distance that current travels between said contact point and each of connector terminals is at least 0.5 meters;
the distance that current travels between said contact point and said separation point is less than 10% of said distance that current travels between said probe tip contact point and said current conductor distal end.

4. The apparatus described in claim 1 wherein:
said probe tip comprises a single piece of metal with a pointed proximal end for engaging a first contact location of a pair of contact locations of an electrical device whose resistance between said location is to be measured;
said cable comprises a coaxial cable having inner and outer conductors forming said first and second conductors, with said conductor proximal ends both lying in said bore and with said probe tip distal end crimped to said conductor proximal ends.

5. A Kelvin probe system for measuring resistance or impedance between a pair of location on an electrical device which includes a Kelvin resistance measuring circuit device that includes first voltage and current circuit terminals and second voltage and current circuit terminals, and a resistance-measuring subcircuit connected to said circuit terminals, said circuit device including a source that flows a current between said first and second current terminals and through the electrical device, comprising:

first and second Kelvin probe assemblies including a first Kelvin probe assembly engaged with said first circuit terminals, and a second Kelvin probe assembly engaged with said second circuit terminals;

said first Kelvin probe assembly including an elongated voltage conductor and an elongated current conductor with each conductor having a distal end connected to one of said first voltage and current circuit terminals, respectively, a handle which can be manually grasped, and a rigid probe tip fixed to said handle, with said probe tip having a proximal end for engaging one of said locations on the electrical device and having a distal location spaced from said proximal end;

said voltage and current conductors being arranged with said current conductor having a proximal end connected to said probe tip distal location to establish a current flow path of predetermined length that extends from said probe tip proximal end and through at least part of said probe tip and through said current conductor to said first current circuit terminal and along which flows all current passing through said current conductor, and with said voltage conductor having a proximal end connected to said current flow path, said voltage conductor separating from connection to said current flow path at a location that is spaced from said probe tip proximal end by no more than 10% of said length of said current flow path.

6. The Kelvin probe system described in claim 5, wherein:

said probe tip has a bore extending into said probe tip from said distal location;

said proximal ends of said voltage and current conductors each extends into said bore of said probe tip and is connected to said probe tip thereat.

7. The Kelvin probe described in claim 5 wherein:

said probe tip has a bore extending into said probe tip of said distal location;

said Kelvin probe system includes a cable that includes said voltage and current conductors, with said proximal ends of said conductors wrapped one about the other and with the wrapped ends projecting into said bore and with said probe tip being crimped around said wrapped ends.

8. The Kelvin probe system described in claim 5 wherein:

said probe tip is rigid and said voltage and current conductors are each flexible and each has a length of at least 0.5 meter, and the distance between said probe tip proximal location and voltage conductor proximal end is no more than 10% of said voltage conductor length.

9. A Kelvin probe for use with another similar probe device and a Kelvin resistance impedance measuring circuit to measure resistance or impedance comprising:

a cable that includes two conductors that each have proximal and distal ends;

a handle (160);

a rigid probe tip (12) fixed said handle, said probe tip having a proximal end that is pointed, and said probe tip having a distal end that has a bore (162);

said proximal ends of said two conductors both lying in said bore of said probe tip and fixed thereat to said probe tip.

10. A Kelvin probe comprising:

a cable that includes two conductors that each has proximal and distal ends;

a handle;

a rigid probe tip fixed to said handle, said probe tip having a proximal end that is pointed, and said probe tip having a distal end that has a bore;

the proximal end of a first of said conductors lying in said bore and the proximal end of the second of said conductors being in electrical engagement with said first conductor immediately outside said bore.

11. A Kelvin probe comprising:

a cable that includes two conductors that each has proximal and distal ends;

a handle;

a rigid probe tip fixed to said handle, said probe tip having a proximal end that is pointed, and said probe tip having a distal end that has a bore with a distal end;

the proximal end of a first of said conductors lying in said bore and the proximal end of the second of said conductors being connected to said probe tip at a location closer to said probe tip than said bore.

* * * * *